(12) United States Patent
Han et al.

(10) Patent No.: US 10,269,669 B2
(45) Date of Patent: Apr. 23, 2019

(54) SEMICONDUCTOR PACKAGE AND METHOD OF FORMING THE SAME

(71) Applicant: TAIWAN SEMICONDUCTOR MANUFACTURING CO., LTD., Hsinchu (TW)

(72) Inventors: Ying-Shin Han, Hsinchu (TW); Yen-Miao Lin, Miaoli County (TW); Chung-Chih Chen, Hsinchu (TW); Hsien-Liang Meng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/616,908

(22) Filed: Jun. 7, 2017

(65) Prior Publication Data

US 2018/0166351 A1    Jun. 14, 2018

Related U.S. Application Data

(60) Provisional application No. 62/434,411, filed on Dec. 14, 2016.

(51) Int. Cl.
*H01L 23/10* (2006.01)
*H01L 21/48* (2006.01)
(Continued)

(52) U.S. Cl.
CPC .......... *H01L 23/10* (2013.01); *H01L 21/4817* (2013.01); *H01L 23/053* (2013.01); *H01L 23/145* (2013.01); *H01L 23/36* (2013.01); *H01L 23/3675* (2013.01); *H01L 23/42* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/13111* (2013.01); *H01L 2224/13116* (2013.01); *H01L 2224/13139* (2013.01); *H01L 2224/13147* (2013.01); *H01L 2224/13155* (2013.01); *H01L 2224/16145* (2013.01); *H01L 2224/16227* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/81815* (2013.01);
(Continued)

(58) Field of Classification Search
None
See application file for complete search history.

(56) References Cited

U.S. PATENT DOCUMENTS

| | | | | |
|---|---|---|---|---|
| 7,187,077 | B1 * | 3/2007 | Nagarajan | H01L 21/50 257/678 |
| 2014/0091461 | A1 * | 4/2014 | Shen | H01L 23/24 257/738 |
| 2017/0263515 | A1 * | 9/2017 | Bolognia | H01L 23/053 |

* cited by examiner

*Primary Examiner* — Long Pham
(74) *Attorney, Agent, or Firm* — Maschoff Brennan

(57) ABSTRACT

A semiconductor package includes a substrate, an integrated circuit die, a lid and an adhesive. The integrated circuit die is disposed over the substrate. The lid is disposed over the substrate. The lid includes a cap portion and a foot portion extending from a bottom surface of the cap portion. The cap portion and the foot portion define a recess, and the integrated circuit die is accommodated in the recess. The adhesive includes a sidewall portion and a bottom portion. The sidewall portion contacts a sidewall of the foot portion. The bottom portion extends from the sidewall portion to between a bottom surface of the foot portion and the substrate.

20 Claims, 4 Drawing Sheets

(51) Int. Cl.
*H01L 23/053* (2006.01)
*H01L 23/00* (2006.01)
*H01L 23/14* (2006.01)
*H01L 23/36* (2006.01)
*H01L 23/367* (2006.01)
*H01L 23/42* (2006.01)

(52) U.S. Cl.
CPC ............... *H01L 2224/92125* (2013.01); *H01L 2224/92225* (2013.01); *H01L 2924/163* (2013.01); *H01L 2924/16251* (2013.01); *H01L 2924/3511* (2013.01); *H01L 2924/3512* (2013.01); *H01L 2924/35121* (2013.01)

SEMICONDUCTOR PACKAGE AND METHOD OF FORMING THE SAME

PRIORITY CLAIM AND CROSS-REFERENCE

This application claims priority to U.S. Provisional Application Ser. No. 62/434,411, filed Dec. 14, 2016, which is herein incorporated by reference.

BACKGROUND

Modern day integrated chips are formed by operating upon a semiconductor wafer using a large number of processing steps (e.g., lithography etching, implantations, depositions, etc.). The processing steps form devices (e.g., transistors) within the semiconductor wafer. Once the processing steps are completed, the semiconductor wafer is diced, or sawed, to separate the semiconductor wafer into a plurality of integrated chip (IC) dies. Each IC die is then packaged, by encasing the IC die in a supporting case, to prevent physical damage and corrosion and to provide for electrical connections between the IC die and a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
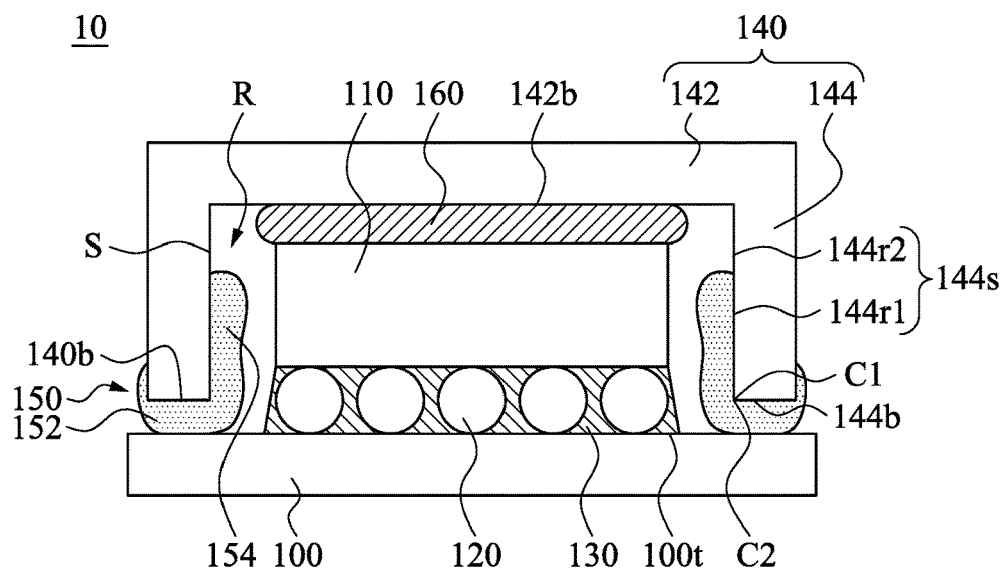
FIG. 1 depicts in a cross-sectional view an example package which is presented for the use of explanation of some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are not limited to particular substrates or particular integrated circuit types and may be advantageously used to mount devices on substrates including, without limitation, flip chip dies with microbumps, solder columns and the like; and heat sinks or heat shields mounted over the dies, substrates with through-substrate-via (TSV), wire bonding, controlled collapsing column connectors ("C4"), solder balls, or other connections, semiconductor substrates including silicon wafers, all materials commonly used in packaging technology. The integrated circuit dies mounted on the substrates may be of any type including memory, digital processors, analog integrated circuits, RF integrated circuits; micro electro-mechanical systems ("MEMS") devices, digital light processors ("DLPs") and generally any semiconductor device, whether discrete or highly integrated, and including passive circuitry and active transistor circuitry.

FIG. 1 depicts in a cross-sectional view an example semiconductor package 10 which is presented for the use of explanation of the embodiments. FIG. 1 depicts a package 10 without visible warpage; this illustration is presented here for explanation of the components. In FIG. 1, substrate 100 and integrated circuit die 110 mounted thereon are depicted. The substrate 100 may provide a structural base and an electrical interface from the integrated circuit die 110 to other devices and systems (not illustrated). For example, the substrate 100 may include multiple conductive layers (not illustrated), some of which are inter-layers within the substrate 100. These layers may be etched into traces of various widths and lengths and connected through inter-layer vias. Together, the lines and vias may form an electrical network to route DC power, ground, and signals from one side of the substrate 100 to the other. In some embodiments, the substrate 100 may include through-substrate-via (TSV) connections. The substrate 100 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Conductive layers and vias may be formed from any suitable conductive material, such as copper, aluminum, silver, gold, other metals, alloys, combination thereof, and/or the like, and formed by any suitable technique, such as electrochemical plating (ECP), electroless plating, other deposition methods such as sputtering, printing, and chemical vapor deposition (CVD) methods, or the like.

In some embodiments, the substrate 100 may include electrical elements, such as resistors, capacitors, signal distribution circuitry, combinations of these, or the like. These electrical elements may be active, passive, or a combination thereof. In other embodiments, the substrate 100 is free from active and passive electrical elements therein. All such combinations are fully intended to be included within the scope of the embodiments.

Integrated circuit die 110 is arranged face down (active surface down) and facing a top surface 100t of the substrate 100. The integrated circuit die 110 is mounted to the substrate 100 using flip chip bonding. The integrated circuit die 110 may be formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the integrated circuit die 110 to construct functional circuitries. In addition, alternating layers of conductive materials (such as copper, aluminum, alloys, doped polysilicon, combinations thereof, or the like) may be utilized between layers of dielectric material to form interconnections between the active and passive devices and also to provide an external connections between the active and passive devices and other external devices. In some embodiments, a plurality of dies 110 may be vertically stacked over the substrate 100 to form a three-dimensional integrated circuit (3DIC) structure.

The electrical connections between the integrated circuit die 110 and the substrate 100 are formed in using solder connections, such as microbumps 120. These microbumps 120 can be formed using solder including lead-based and lead-free eutectic materials. Solder may include copper, tin, silver, lead, nickel, and other materials. In some embodiments, lead based solder may include lead and tin. In some embodiments, lead free solder may include copper, silver, and tin. The physical and electrical connections between the integrated circuit die 110 and the top surface 100t of the substrate 100 are formed by a thermal reflow of the solder connections. In some embodiments, other connections including solder columns, controlled collapsing column connectors ("C4") connectors, stud bumps, solder balls and solder bumps, may be used as alternatives to microbumps 120.

In some embodiments, there may be a coefficient of thermal expansion ("CTE") mismatch between the integrated circuit die 110 and the substrate 100. For example, the CTE of silicon may be about 2.5 ppm/degrees Celsius, while substrate materials may have CTEs that are several times higher, such as about 7 ppm/degrees Celsius for ceramic and as much as 15 ppm/degrees Celsius for organic substrates. Thus, without some stress relief, the CTE mismatch can cause a high level of stress in the solder connectors, including cracking and pull off. Underfill 130 is therefore used with flip chip mounted integrated circuits to provide the stress relief. These materials are often of liquid epoxy resin when applied or provided, and then are thermally cured at a temperature of greater than 140 degrees Celsius for some time period, perhaps 30 minutes to several hours, to cure as a hardened epoxy or resin. In other words, underfill 130, such as silica filled epoxy resin, may be used to fill gap space in between the microbumps 120 and in between the die 110 and the substrate 100. The underfill 130 can increase mechanical reliability by distributing stresses across the top surface 100t of substrate 100 rather than allowing them to become concentrated in the microbumps 120. In addition, the underfill 130 provides encapsulation from moisture and contaminants in the external environment as well.

Lid 140 is disposed over the integrated circuit die 110 to accommodate the integrated circuit die 110 therein. For example, the lid 140 may include a cap portion 142 and a foot portion 144. The foot portion 144 extends from a bottom surface 142b of the cap portion 142. The foot portion 144 forms a ring capped by the cap portion 142, so that the cap portion 142 and the foot portion 144 can define a recess R. The integrated circuit die 110 is accommodated in the recess R. Alternatively stated, the lid 140 includes a bottom surface 140b, and the recess R is formed in the bottom surface 140b of the lid 140. The lid 140 may have a high thermal conductivity greater than about 100 W/m*K, for example, and may be formed using a metal, a metal alloy, or the like. In some embodiments, the lid 140 can be formed of any suitable thermally conductive material, such as copper and its alloys, or aluminum and its alloys. In some embodiments, the lid 140 may be formed of copper or a copper alloy with a nickel, palladium, or platinum or alloy coating to reduce corrosion.

Adhesive 150 is provided to secure the lid 140 to the substrate 100. More particularly, the adhesive 150 is present at least between the bottom surface 140b of the lid 140 and the top surface 100t of the substrate 100, so as to provide adhesion to affix the overlying lid 140 to the underlying substrate 100. In other words, the adhesive 150 may be in contact with the bottom surface 140b of the lid 140 as well as the top surface 100t of the substrate 100. The adhesive 150 may include materials suitable for sealing the lid 140 onto the substrate 100, such as epoxies, urethane, polyurethane, silicone elastomers, or the like.

In some embodiments, the adhesive 150 extends onto a sidewall S of the recess R, and hence the adhesive 150 can provide improved adhesion strength to the lid 140 and the substrate 100. Such improved adhesion strength may be advantageous to improve device yield or reliability. For example, in some embodiments, the substrate 100 are subject to negative warpage, which means the warpage causes edges of the substrate 100 to be lower than center of the substrate 100 and thus has a negative value. If the sidewall S of the recess R is free from coverage of the adhesive 150, the adhesion strength may be too low to affix the lid 140 to the negatively warping substrate 100. On the contrary, in some embodiments where the adhesive 150 extends onto the sidewall S of the recess R, the adhesion strength provided to the lid 140 and the substrate 100 can be improved in comparison with that in embodiments where the sidewall S is free from coverage of the adhesive 150, and hence the improved adhesion strength may be high enough to prevent delamination of the lid 140 from the substrate 100.

In some embodiments, the adhesive 150 includes a base 152 and a protrusion 154. In some embodiments where the adhesive 150 is a homogeneous adhesive, the base 152 and the protrusion 154 are formed of a homogeneous adhesive material. In other words, the base 152 and the protrusion 154 are monolithically connected. The base 152 lies on the top surface 100t of the substrate 100 and extends into a gap between the substrate 100 and the bottom surface 140b of the lid 140. In other words, the protrusion 154 protrudes from the base 152 into the recess R along the sidewall S of the recess R. Stated differently, the protrusion 154 is present between the sidewall S and the die 110. The protrusion 154 can be in contact with the sidewall S of the recess R, and the base 152 can be in contact with the bottom surface 140b of the overlying lid 140 and the top surface 100t of the underlying substrate 100. Therefore, the adhesion strength provided by the adhesive 150 can be enhanced, and such enhancement may be advantageous to prevent delamination of the lid 140 from the substrate 100.

Alternatively stated, the foot portion 144 of the lid 140 includes an inner sidewall 144s and a bottom surface 144b. The recess R is defined by the inner sidewall 144s of the foot portion 144, and hence the inner sidewall 144s of the foot portion 144 can be referred to as the sidewall S of the recess R in some embodiments. In addition, the bottom surface 144b of the foot portion 144 is lowest in the lid 140, and hence the bottom surface 144b of the foot portion 144 can be referred to as the bottom surface 140b of the lid 140 in some embodiments. The protrusion 154 is present on the inner sidewall 144s, and can be referred to as a sidewall portion of the adhesive 150. The base 152 extends from the sidewall portion 154 to between the bottom surface 144b and the substrate 100, and can be referred to as a bottom portion of the adhesive 150. The sidewall portion 154 and the bottom portion 152 are respectively in contact with the inner sidewall 144s and the bottom surface 144b of the foot portion 144, so that the adhesion strength provided by the adhesive 150 can be enhanced.

In some embodiments, the adhesive 150 is substantially conformal to a lid corner C1 between the bottom surface 144b and the inner sidewall 144s of the foot portion 144. In other words, the adhesive 150 is coated around the lid corner C1 of the foot portion 144 in a substantially conformal manner. Stated differently, the protrusion 154 and the base 152 form an adhesive corner C2. The lid corner C1 overlaps with the adhesive corner C2. Alternatively stated, the base 152 and the protrusion 154 coincide at the lid corner C1, or the bottom surface 144b and the inner sidewall 144s coincide at the adhesive corner C2. Such conformal configuration may be advantageous to further improve the adhesion strength provided to the lid 140 and the substrate 100. This is due to the fact that not only the bottom surface 144b and the inner sidewall 144s of the foot portion 144 are coated with the adhesive 150, but the lid corner C1 is also coated with the adhesive 150.

In some embodiments, the protrusion 154 of the adhesive 150 covers a majority of the inner sidewall 144s of the foot portion 144, so that the adhesion strength can be further improved. More particularly, majority of the inner sidewall 144s of the foot portion 144 is in contact with the protrusion 154 of the adhesive 150. For example, the inner sidewall 144s has a covered region 144r1 and an uncovered region 144r2 between the cap portion 142 and the covered region 144r1. In other words, the uncovered region 144r2 is higher than the covered region 144r1. The covered region 144r1 of the inner sidewall 144s is covered by the protrusion 154 of the adhesive 150, and the uncovered region 144r2 of the inner sidewall 144s is free from coverage of the adhesive 150. In some embodiments, height H1 of the covered region 144r1 and total height H2 of the inner sidewall 144s may satisfy: $H1 > \frac{1}{2} \times H2$. In some other embodiments, height H1 of the covered region 144r1 and total height H2 of the inner sidewall 144s may satisfy: $\frac{1}{3} \times H2 < H1 < \frac{4}{5} \times H2$.

In some embodiments, the protrusion 154 of the adhesive 150 is spaced apart from the integrated circuit die 110, and hence unwanted adhesion to sidewall of the integrated circuit die 110 can be prevented. In some embodiments, the protrusion 154 of the adhesive 150 is spaced apart from the underfill 130, and hence unwanted adhesion to sidewall of the underfill 130 can be prevented as well.

In some embodiments where the foot portion 144 of the lid 140 forms a ring, such as a rectangular ring around the integrated circuit die 110, the protrusion 154 of the adhesive 150 may be encircled by the ring formed by the foot portion 144. In other words, the protrusion 154 of the adhesive 150 can be enclosed by the foot portion 144. In some embodiments, the adhesive 150 may form a ring around the integrated circuit die 110 as well.

Figure 2:
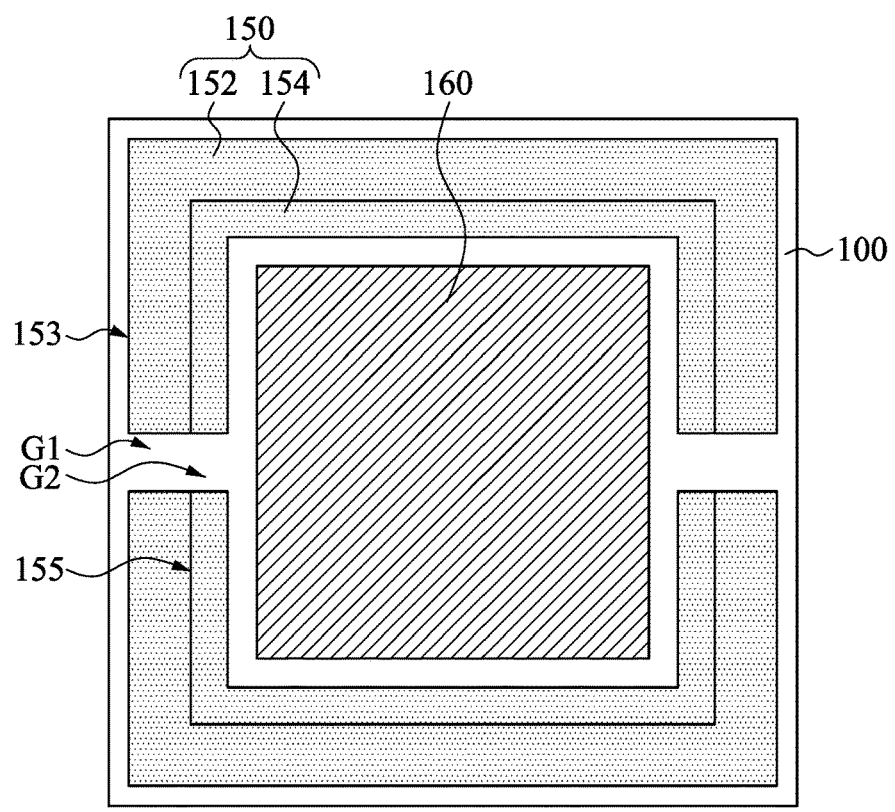
FIG. 2 is a top view of the semiconductor package in FIG. 1 without illustrating the lid.

More particularly, as illustrated in FIG. 2, which is a top view of the package without illustrating the lid 140, it can be seen that the base 152 forms a bottom ring 153, and the protrusion 154 forms a top ring 155 stacked over the bottom ring 153. The protrusion 154 protrudes from a partial region of top surface of the base 152, and hence the protrusion 154 has a width less than that of the base 152. Therefore, the top ring 155 formed by the protrusion 154 has a ring thickness less than that of the bottom ring 153 formed by the base 152, and hence the top ring 155 can be referred to as a relatively thin ring, and the bottom ring 153 can be referred to as a relatively thick ring underlying the relatively thin ring. The base 152 and protrusion 154 are formed in the same dispensing process in some embodiments, and therefore, the relatively thin ring 155 is concentrically stacked over the relatively thick ring 153.

In some embodiments, as illustrated in FIGS. 1 and 2, the top ring 155 formed by the protrusion 154 of the adhesive 150 is encircled or enclosed by the ring formed by the foot portion 144 of the lid 140. Alternatively stated, the top ring 155 can be referred to as an adhesive ring, and the ring formed by the foot portion 144 can be referred to as a non-adhesive ring around the adhesive ring. In some embodiments, the top ring 155 is arranged concentrically inside the ring formed by the foot portion 144. More particularly, the top ring 155 is in contact with the annular inner sidewall 144s of the foot portion 144. In some embodiments, the ring formed by the foot portion 144 is stacked over the bottom ring 153 formed by the base 152. More particularly, the ring formed by the foot portion 144 is concentrically stacked over the bottom ring 153. For example, the bottom ring 153 of the adhesive 150 is in contact with and compressed by the annular bottom surface 144b of the foot portion 144. In some embodiments, the integrated circuit die 110 is enclosed or encircled by the top ring 155, and center of the top ring 155 is located within the integrated circuit die 110.

In some embodiments, as shown in FIG. 2, the bottom and top rings 153 and 155 are broken rings. In other words, the bottom and top rings 153 and 155 have gaps G1 and G2. These gaps G1 and G2 are substantially aligned and formed due to the dispensing pattern of the adhesive 150 in some embodiments. In some alternative embodiments, the bottom and top rings 153 and 155 are free from gaps.

In some embodiments, as illustrated in FIG. 1, thermal interface material ("TIM") 160 may be disposed on upper or back side of the integrated circuit die 110 and may contact the integrated circuit die 110 and bottom surface 142b of the cap portion 142 of the lid 140. Therefore, the TIM 160 can provide a thermally conductive path between the upper side of integrated circuit die 110 and the lid 140 to improve thermal removal when the integrated circuit die 110 is operating. The TIM 160 is thermally conductive but is an electrical insulator, so that it does not create undesired shorts. In some embodiments, the TIM 160 has a good thermal conductivity, which may be greater than about 2 W/m*K, and may be as equal to, or higher than, about 10 W/m*K or about 50 W/m*K. The adhesive 150 may have a better adhering ability and a lower thermal conductivity than the TIM 160. For example, the adhesive 150 may have a thermal conductivity lower than about 0.5 W/m*K. In some embodiments, the TIM 160 is spaced apart from the adhesive 150, especially the protrusion 154 on the inner sidewall 144s of the foot portion 144. In some embodiments, the protrusion 154 of the adhesive 150 has a top lower than a bottom of the TIM 160.

In some embodiments, the TIM 160 may include epoxy, silicone, inorganic materials such as a lightly cross-linked silicone polymer, one or more matrix polymers, a polymer with one or more thermally conductive fillers, other materials, or multiple layers or combinations thereof, as examples. In embodiments where the TIM 160 includes a matrix polymer, the matrix polymer may include ethylene-propylene, an ethylene-propylene-diene monomer, hydrogenated polyisoprene, or a combination thereof. In embodiments where the TIM 160 includes a thermally conductive filler, the thermally conductive filler may include aluminum oxide, boron nitride, aluminum nitride, aluminum, copper, silver, indium, or a combination thereof. The thermally conductive filler is dispersed within the TIM 160 and has a percentage weight within the TIM 160 of about 10 weight percent to about 90 weight percent in some embodiments, for example. Alternatively, the TIM 160 may include other materials, filler, and properties.

Figure 3:
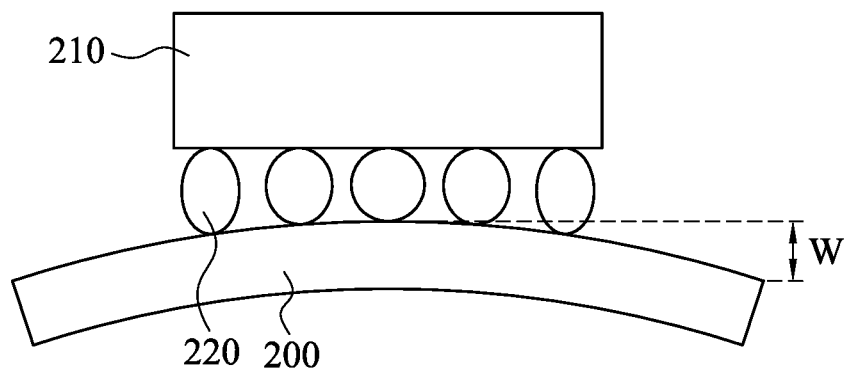
FIG. 3 depicts in a cross-section a substrate and package assembly at an intermediate step of some embodiments.

In FIG. 3, a cross-section of a substrate 200 and an integrated circuit die 210 is shown to illustrate a first intermediate process step in accordance with some embodiments. The substrate 200 may include TSV connections and may be of any of the materials described above. Integrated circuit die 210 is shown flip chip mounted to substrate 200 using microbumps 220. In this example, the distance "W" illustrates the warpage of the substrate 200. In FIG. 3, and the subsequent figures below, the substrate warpage is shown in an exaggerated fashion for illustration and explanation of the embodiments. As can be seen, this warpage may cause non-uniform shapes in the microbumps 220. The microbumps 220 are non-uniform in shape, and in this example are particularly elongated at the corners of the integrated circuit die 210 because the substrate 100 is negatively warped.

Figure 4:
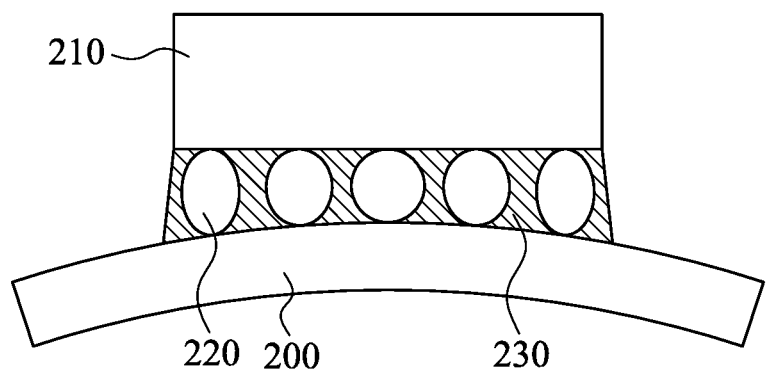
FIG. 4 depicts in a cross-section the package assembly of FIG. 3 following additional processing of some embodiments.

FIG. 4 illustrates in a cross-section the substrate 200 of FIG. 3 after underfill is dispensed in an additional process step. Now underfill 230 is shown positioned between the integrated circuit die 210 and the substrate 200. The underfill material may be a high glass transition temperature (Tg) underfill, with a Tg greater than 140 degrees C., for example. Even higher Tg materials may be used, such as Tg greater than 150 degrees C. Other underfills with lower Tg values may be used in some embodiments. Thereafter, a reflow operation may be optionally performed to reflow the microbumps 220 in some embodiments.

Figure 5:
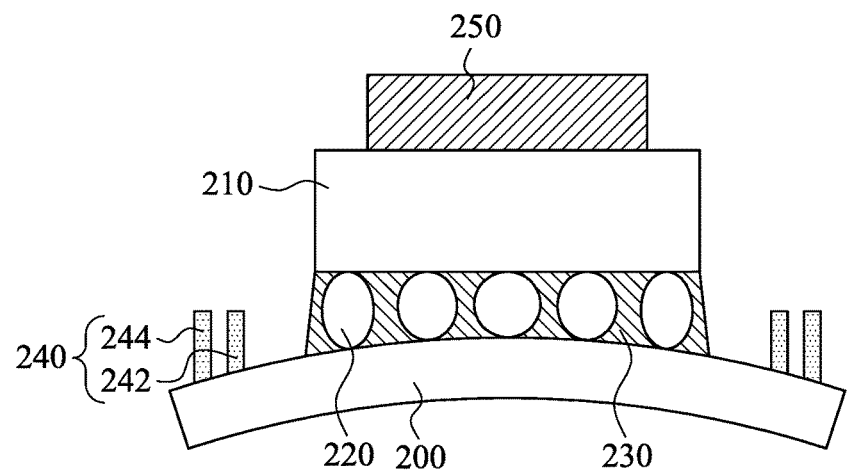
FIG. 5 depicts in a cross-section the package assembly of FIG. 4 following additional processing of some embodiments.
Figure 6:
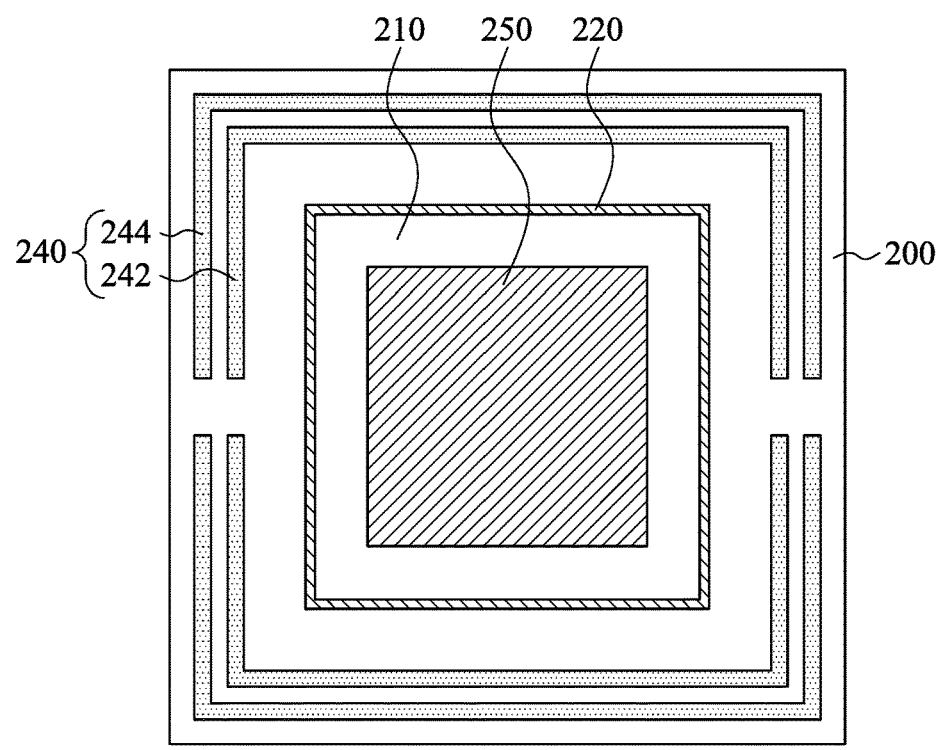
FIG. 6 is a top view of the package assembly in FIG. 5.

In FIG. 5, a cross-section of the substrate 200 of FIG. 4 is shown, following additional process steps of some embodiments. The substrate 200 is shown, with integrated circuit die 210 mounted face down over the substrate 200 and underfill 230 surrounding the microbumps 220 as before. Adhesive 240 is dispensed on the substrate 200 and may be of any of the materials discussed above. The adhesive 240 can be wet dispensed to an outer portion or a periphery or edges of substrate 200 by means of an adhesive dispenser having a needle-type dispensing head or a stamp-type dispensing head. In some embodiments, the adhesive 240 may be a material that is subject to thermal cure. Dispensing pattern of the adhesive 240 can be designed such that a portion of the adhesive 240 can be squeezed onto a sidewall of a lid in subsequent steps. For example, as shown in FIG. 6, which is a top view of the structure in FIG. 5, inner and outer adhesive rings 242 and 244 are dispensed on the substrate 200 using suitable dispensing head, such as needle-type dispensing head. The inner and outer adhesive rings 242 and 244 are dispensed around the integrated circuit die 210 in a concentric manner. Alternatively stated, the inner adhesive ring 242 is dispensed between the outer adhesive ring 244 and the integrated circuit die 210, and the inner and outer adhesive rings 242 and 244 are kept a substantially constant distance apart. At least a portion of the inner adhesive ring 242 can be squeezed onto the inner sidewall of the lid in subsequent steps. As illustrated, in some embodiments, the inner and outer adhesive rings 242 and 244 can be dispensed as broken rings.

TIM 250 is dispensed on the integrated circuit die 210 and may be of any of the materials described above. Dispensing of the TIM 250 can be performed by a needle-type dispensing head or a stamp-type dispensing head. If the TIM 250 is a solid, it may be heated to a temperature at which it undergoes a solid to liquid transition and then may be applied in liquid form to integrated circuit die 210.

Figure 7:
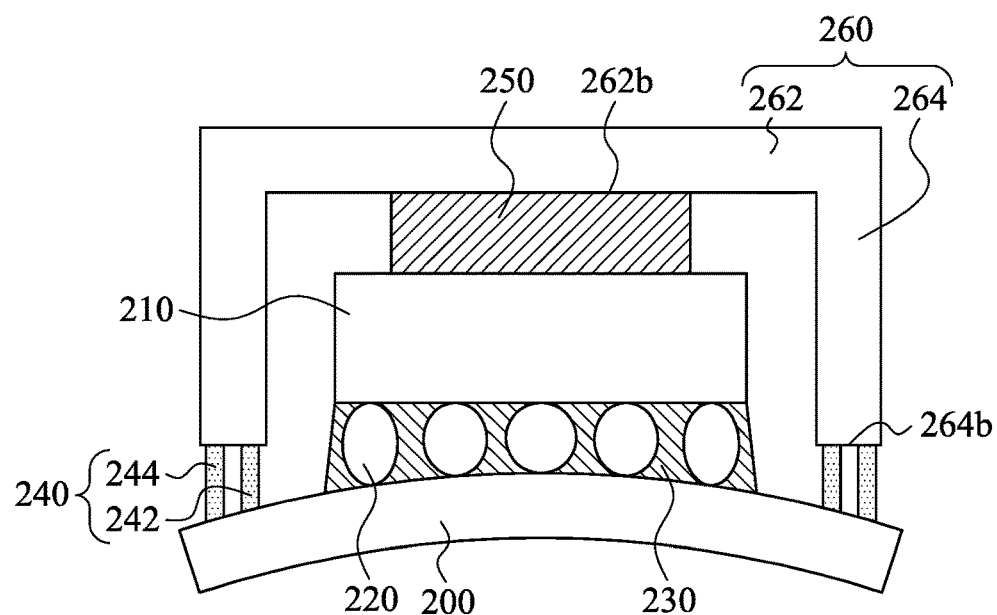
FIG. 7 depicts in a cross-section the package assembly of FIG. 5 following additional processing of some embodiments.

In FIG. 7, the substrate 200 of FIG. 6 is depicted in a cross-section following additional process steps of some embodiments. Lid 260 is placed over the integrated circuit die 210 and is in physical contact with TIM 250 and at least a portion of the adhesive 240. For example, cap portion 262 of the lid 260 has a bottom surface 262b in contact with the TIM 250, and foot portion 264 of the lid 260 has a bottom surface 264b in contact with the inner and outer adhesive rings 242 and 244.

Figure 8:
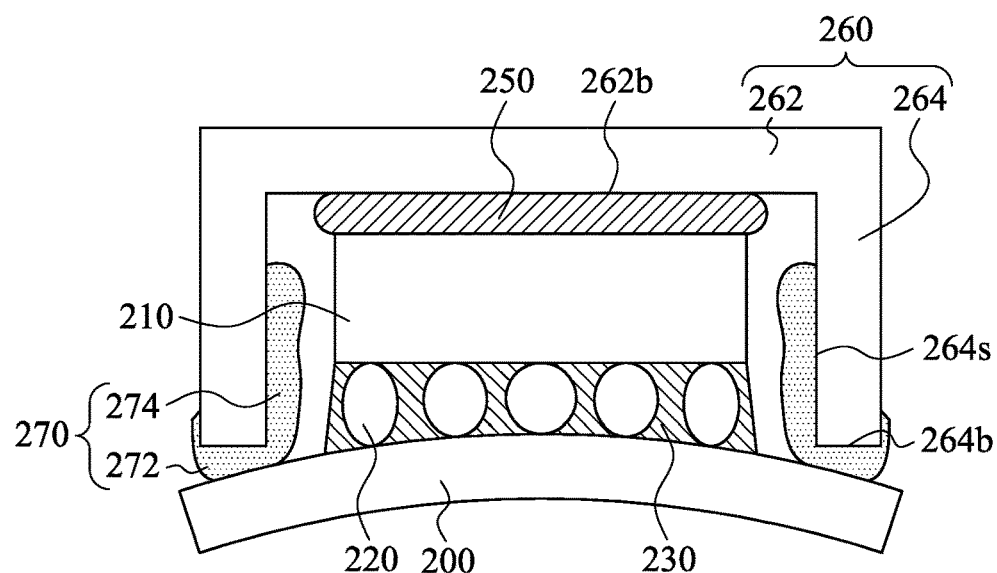
FIG. 8 depicts in a cross-section the package assembly of FIG. 7 following additional processing of some embodiments.

Thereafter, as shown in FIG. 8, the lid 260 is pressed against the substrate 200 such that a portion of the adhesive 240 is squeezed from a gap space between the bottom surface 264b of the lid 260 and the substrate 200 to an inner sidewall 264s of the lid 260. For example, a clamping apparatus can exert a downward force on the lid 260 to compress the adhesive 240 as a deformed adhesive 270 with substantial L-shaped cross section. The deformed adhesive 270 includes a base 272 and a protrusion 274. The base 272 is sandwiched between the bottom surface 264b of the foot portion 264 and the negatively warping substrate 200, while the protrusion 274 is in contact with the inner sidewall 264s of the foot portion 264. Therefore, the adhesion strength provided to the lid 260 and the negatively warping substrate 200 can be improved, and hence is advantageous to prevent delamination of the lid 260 from the negatively warping substrate 200. It is understood that additional processes may be performed before, during, or after the adhesive and/or TIM application processes to complete the fabrication of the semiconductor device, but these additional processes are not discussed herein in detail for the sake of simplicity. For example, after squeezing adhesive, heat may be applied to the package to cure adhesive and TIM by increasing the temperature of the TIM 250 and the deformed adhesive 270.

In some embodiments, the inner and outer adhesive rings 242 and 244 (as shown in FIG. 4) are dispensed at a distance short enough such that the inner and outer adhesive rings 242 and 244 are squeezed to adjoin each other during pressing the lid 260. Therefore, the deformed adhesive 270 can have a structurally continuous base 272 for sealing the lid 260 onto the substrate 200.

Embodiments of the present disclosure may have at least following advantages. Due to a portion of the adhesive on the sidewall of the lid, the adhesion strength provided to the lid and the substrate can be improved. The improved adhesion strength may be thus advantageous to prevent delamination of the lid from the substrate, especially from a negatively warping substrate.

In accordance with some embodiments, a semiconductor package includes a substrate, an integrated circuit die, a lid and an adhesive. The integrated circuit die is disposed over the substrate. The lid is disposed over the substrate. The lid includes a cap portion and a foot portion extending from a bottom surface of the cap portion. The cap portion and the foot portion define a recess, and the integrated circuit die is accommodated in the recess. The adhesive includes a sidewall portion and a bottom portion. The sidewall portion contacts a sidewall of the foot portion. The bottom portion extends from the sidewall portion to between a bottom surface of the foot portion and the substrate.

In accordance with some embodiments, a semiconductor package includes a substrate, an integrated circuit die, a lid and an adhesive. The integrated circuit die is disposed over the substrate. The lid is disposed over the substrate. The lid has a bottom surface and a recess in the bottom surface. The integrated circuit die is received in the recess. The adhesive includes a base and a protrusion. The base extends into a gap between the substrate and the bottom surface of the lid. The protrusion protrudes from the base into the recess along a sidewall of the recess.

In accordance with some embodiments, a method of forming a semiconductor package includes dispensing an adhesive on a substrate having an integrated circuit die attached thereon, placing a lid over the integrated circuit die such that a bottom surface of the lid caps at least a portion of the adhesive, and pressing the lid against the substrate such that a portion of the adhesive is squeezed from a space between the bottom surface of the lid and the substrate onto a sidewall of the lid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a substrate;
an integrated circuit die over the substrate;
a lid over the substrate, wherein the lid comprises a cap portion and a foot portion extending from a bottom surface of the cap portion, wherein the cap portion and the foot portion define a recess, and the integrated circuit die is accommodated in the recess;
an adhesive comprising a sidewall portion and a bottom portion, wherein the sidewall portion contacts an inner sidewall of the foot portion, wherein the bottom portion extends from the sidewall portion to between a bottom surface of the foot portion and the substrate, and wherein the adhesive covers a majority of the inner sidewall of the foot portion; and
an underfill between the substrate and the integrated circuit die, wherein the sidewall portion of the adhesive is spaced apart from the underfill.

2. The semiconductor package of claim 1, wherein the adhesive is substantially conformal to a corner between the bottom surface and the inner sidewall of the foot portion.

3. The semiconductor package of claim 1, wherein the inner sidewall and the bottom surface of the foot portion form a first corner, the sidewall portion and the bottom portion of the adhesive form a second corner, and wherein the first corner overlaps with the second corner.

4. The semiconductor package of claim 1, wherein the sidewall portion and the bottom portion are made of a homogeneous adhesive material.

5. The semiconductor package of claim 1, wherein the sidewall portion of the adhesive is enclosed by the foot portion of the lid.

6. The semiconductor package of claim 1, wherein the integrated circuit die is enclosed by the sidewall portion of the adhesive.

7. The semiconductor package of claim 1, wherein the sidewall portion of the adhesive is between the foot portion of the lid and the integrated circuit die.

8. The semiconductor package of claim 7, wherein the sidewall portion of the adhesive is spaced apart from the integrated circuit die.

9. The semiconductor package of claim 1, wherein the bottom portion forms a relatively thick ring, and wherein the sidewall portion forms a relatively thin ring stacked over the relatively thick ring.

10. The semiconductor package of claim 9, wherein the relatively thick ring and the relatively thin ring are concentrically stacked.

11. A semiconductor package, comprising:
a substrate;
an integrated circuit die over the substrate;
a lid over the substrate, the lid having a bottom surface and a recess in the bottom surface, wherein the integrated circuit die is received in the recess; and
an adhesive comprising a base and a protrusion, wherein the base extends into a gap between the substrate and the bottom surface of the lid, wherein the protrusion protrudes from the base into the recess along a sidewall of the recess, and wherein the adhesive has a bottom surface non-parallel with a bottom surface of the lid.

12. The semiconductor package of claim 11, wherein the protrusion covers a majority of the sidewall of the recess of the lid.

13. The semiconductor package of claim 11, wherein the base and the protrusion coincide at a corner between the bottom surface of the lid and the sidewall of the recess.

14. The semiconductor package of claim 11, wherein the protrusion forms an adhesive ring, and wherein the sidewall of the recess forms a non-adhesive ring around the adhesive ring.

15. The semiconductor package of claim 11, wherein the base and the protrusion are monolithically connected.

16. A semiconductor package, comprising:
a substrate;
a lid over the substrate and comprising a cap portion and a foot portion extending from the cap portion towards the substrate;
an integrated circuit die between the cap portion of the lid and the substrate; and
an adhesive on the substrate, wherein the foot portion of the lid is embedded in the adhesive, wherein the adhesive comprises a first portion on an inner sidewall of the foot portion and a second portion on an outer sidewall of the foot portion, and a top end of the first portion is in a position higher than a top end of the second portion.

17. The semiconductor package of claim 16, wherein the first portion of the adhesive is separated from the integrated circuit die.

18. The semiconductor package of claim 1, wherein the bottom portion of the adhesive is in contact with a curved surface of the substrate.

19. The semiconductor package of claim 11, wherein a top of the adhesive is in a position lower than top of the integrated circuit die.

20. The semiconductor package of claim 1, further comprising a thermal interface material between the integrated circuit die and the lid.

* * * * *